United States Patent
Agilandam et al.

(10) Patent No.: US 7,068,032 B2
(45) Date of Patent: Jun. 27, 2006

(54) GAIN ADJUSTMENT METHOD AND MAGNETIC RESONANCE IMAGING APPARATUS

(75) Inventors: Kasi Viswanathan Agilandam, Bangalore (IN); Anasuya Mohan Rao, Bangalore (IN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 62 days.

(21) Appl. No.: 10/882,907

(22) Filed: Jun. 30, 2004

(65) Prior Publication Data

US 2005/0001620 A1 Jan. 6, 2005

(30) Foreign Application Priority Data

Jul. 2, 2003 (JP) .............................. 2003-190112

(51) Int. Cl.
*G01V 3/00* (2006.01)

(52) U.S. Cl. ..................................... 324/309; 324/307

(58) Field of Classification Search ................ 324/309, 324/307, 308, 318, 322

See application file for complete search history.

(56) References Cited

U.S. PATENT DOCUMENTS

| 4,700,138 | A | | 10/1987 | Shimazaki et al. |
| 4,767,992 | A | * | 8/1988 | Ueyama ..................... 324/313 |
| 4,789,830 | A | * | 12/1988 | Stokar ........................ 324/308 |
| 4,806,866 | A | | 2/1989 | Maier |
| 5,451,876 | A | * | 9/1995 | Sandford et al. ........... 324/322 |
| 6,448,770 | B1 | | 9/2002 | Liu et al. |

FOREIGN PATENT DOCUMENTS

| EP | 0431684 A1 | 6/1991 |
| JP | 2002-336213 | 11/2002 |

OTHER PUBLICATIONS

European Search Report; The Hague; Mar. 1, 2005; EP04253921; 2 pgs.

* cited by examiner

*Primary Examiner*—Louis M. Arana
(74) *Attorney, Agent, or Firm*—Carl B. Horton, Esq.; Armstrong Teasdale LLP

(57) ABSTRACT

A method for adjusting a gain for reception of a magnetic resonance signal in a magnetic resonance imaging apparatus includes defining an initially set value of a slice thickness as slthick-original, defining a gain fit therefor as prescan-R1, and calculating a gain realtime-R1 fit for a changed value slthick-realtime of the slice thickness in accordance with:

realtime-R1=(prescan-R1−(int)(log(slthick-realtime/slthick-original)+0.99)).

12 Claims, 7 Drawing Sheets

GAIN ADJUSTMENT METHOD AND MAGNETIC RESONANCE IMAGING APPARATUS

This application claims the benefit of Japanese Application No. 2003-190112 filed Jul. 2, 2003.

BACKGROUND OF THE INVENTION

The present invention relates to a gain adjustment method and a magnetic resonance imaging apparatus, and particularly, to a method of adjusting a gain for reception of a magnetic resonance signal and a magnetic resonance imaging apparatus equipped with gain adjusting means for reception of a magnetic resonance signal.

In a magnetic resonance imaging (MRI: Magnetic Resonance Imaging) apparatus, a gain is adjusted in such a manner that a receiving level of a magnetic resonance signal becomes proper. The adjustment of the gain is dynamically performed during one scan so as to prevent a reduction in an SNR (signal-to-noise ratio). A post-reception signal is normalized in accordance with to the gain, and image reconstruction is carried out based on the signal after the normalization (e.g., refer to the following patent literature 1).

[Patent Literature 1]

Specification of U.S. Pat. No. 5,451,876 (fifth to sixth columns and FIGS. 1 through 3)

There may be a case in which, when magnetic resonance imaging is carried out in real time, the imaging is done while a slice thickness and a field of view (FOV) are being changed in various ways. Since, however, the conventional gain adjustment is not associated with it, clipping or the like of a data due to an over range of an A/D converter occurs when the slice thickness and FOV have been increased, so that there is a problem that proper imaging cannot be carried out.

SUMMARY OF THE INVENTION

Therefore, an object of the present invention is to realize a gain adjustment method fit for realtime imaging, and a magnetic resonance imaging apparatus which performs a gain adjustment fit for realtime imaging.

(1) The invention according to one aspect, for solving the above-described problem is a gain adjustment method wherein in adjusting a gain for reception of a magnetic resonance signal in a magnetic resonance imaging apparatus, when an initially set value of a slice thickness is slthick-original and a gain fit therefor is prescan-R1, a gain realtime-R1 fit for a changed value slthick-realtime of the slice thickness is represented as follows:

$$\text{realtime-}R1=(\text{prescan-}R1-(\text{int})(\log(\text{slthick-realtime}/\text{slthick-original})+0.99)).$$

(2) The invention according to another aspect, for solving the above-described problem is a magnetic resonance imaging apparatus having inducing means for applying a static magnetic field, a gradient magnetic field and an RF magnetic field to a target to be imaged to generate a magnetic resonance signal, receiving means for receiving the above-described generated magnetic resonance signal, adjusting means for adjusting a gain of the above-described receiving means, and reconstructing means for reconstructing an image based on the above-described received magnetic resonance signal, wherein the above-described adjusting means comprises setting means for setting a slice thickness, determining means for determining a gain fit for an initially set value of the slice thickness, and calculating means for obtaining a gain realtime-R1 fit for a changed value slthick-realtime of the slice thickness by means of the following equation when an initially set value of the above-described slice thickness is slthick-original, and a gain fit therefor is prescan-R1:

$$\text{realtime-}R1=(\text{prescan-}R1-(\text{int})(\log(\text{slthick-realtime}/\text{slthick-original})+0.99)).$$

In the invention according to the aspect of (1) or (2), the gain realtime-R1 fit for the changed value slthick-realtime of the slice thickness is obtained by realtime-R1=(prescan-R1=(int)(log(slthick-realtime/slthick-original)+0.99)) when the initially set value of the slice thickness is slthick-original and the gain fit for it is prescan-R1. It is therefore possible to always appropriatize the gain regardless of a change in the slice thickness.

(3) The invention according to a further aspect, for solving the above-described problem is a gain adjustment method wherein in adjusting a gain for reception of a magnetic resonance signal in a magnetic resonance imaging apparatus, when an initially set value of a field of view is FOV-original, and a gain fit therefor is prescan-R1, a gain realtime-R1 fit for a changed value FOV-original of the field of view is expressed in the following equation:

$$\text{realtime-}R1=(\text{prescan-}R1-(\text{int})(\log(\text{FOV-realtime}/\text{FOV-original})+0.99)).$$

(4) The invention according to a still further aspect, for solving the above-described problem is a magnetic resonance imaging apparatus having inducing means for applying a static magnetic field, a gradient magnetic field and an RF magnetic field to a target to be imaged to generate a magnetic resonance signal, receiving means for receiving the above-described generated magnetic resonance signal, adjusting means for adjusting a gain of the above-described receiving means, and reconstructing means for reconstructing an image based on the above-described received magnetic resonance signal, wherein the above-described adjusting means comprises setting means for setting a field of view, determining means for determining a gain fit for an initially set value of the above-described field of view, and calculating means for obtaining a gain realtime-R1 fit for a changed value FOV-realtime of the field of view by means of the following equation when an initially set value of the above-described field of view is FOV-original, and a gain fit therefor is prescan-R1:

$$\text{realtime-}R1=(\text{prescan-}R1-(\text{int})(\log(\text{FOV-realtime}/\text{FOV-original})+0.99)).$$

In the invention according to the aspect of (3) or (4), the gain realtime-R1 fit for the changed value FOV-realtime of the field of view is obtained by realtime-R1=(prescan-R1−(int)(log(FOV-realtime/FOV-original)+0.99)) when the initially set value of the field of view is FOV-original and the gain fit for it is prescan-R1. It is therefore possible to always appropriatize the gain regardless of a change in the field of view.

When the above-described gain realtime-R1 is larger than a predetermined maximum value maximum-R1, to establish realtime-R1=maximum-R1 is preferable in terms of improvement in the stability of a gain. When the above-described gain realtime-R1 is smaller than a predetermined minimum value minimum-R1, to establish realtime-R1=minimum-R1 is preferable in terms of improvement in the stability of a gain.

According to the present invention, a gain adjustment method suitable for realtime imaging, and a magnetic resonance imaging apparatus which performs a gain adjustment fit for realtime imaging, can be realized.

Further objects and advantages of the present invention will be apparent from the following description of the preferred embodiments of the invention as illustrated in the accompanying drawings.

DETAILED DESCRIPTION OF THE INVENTION

Figure 1:
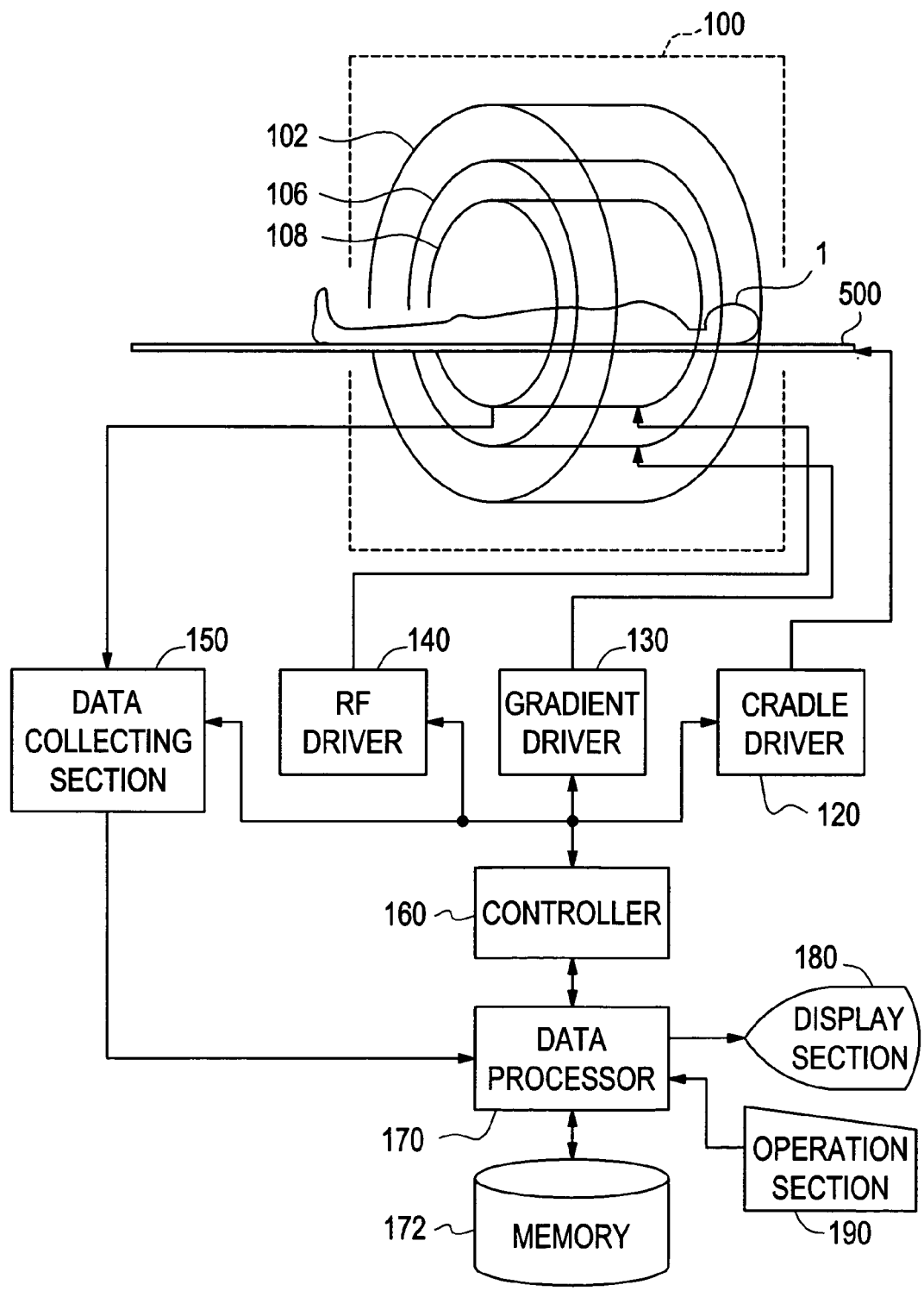
FIG. 1 is a block diagram of an apparatus showing one example of an embodiment of the present invention.

Embodiments of the present invention will hereinafter be described in detail with reference to the accompanying drawings. A block diagram of a magnetic resonance imaging apparatus is shown in FIG. 1. This apparatus is one example illustrative of an embodiment of the present invention. One example illustrative of an embodiment related to an apparatus of the present invention is shown according to the configuration of this apparatus. One example illustrative of an embodiment related to a method of the present invention is shown according to the operation of this apparatus.

As shown in the same drawing, this apparatus has a magnetic apparatus 100. The magnetic apparatus 100 has a main magnetic field coil section 102, a gradient coil section 106 and an RF coil (radio frequency coil) section 108. These respective coil sections respectively have substantially cylindrical shapes and are disposed coaxially with one another. A target (patient) 1 to be imaged is placed on a cradle 500 in a substantially columnar internal bore of the magnetic apparatus 100 and carried in.

The cradle 500 is driven by a cradle driver 120. Thus, the target 1 can be moved in its body axis direction in an internal bore of the magnet apparatus.

The main magnetic field coil section 102 forms a static magnetic field in the internal bore of the magnetic apparatus 100. The direction of the static magnetic field is approximately parallel to the direction of the body axis of the target 1. Namely, the main magnetic field coil section 102 forms a so-called horizontal magnetic field. The main magnetic field coil section 102 is configured using a superconductive coil, for example. Incidentally, the main magnetic field coil section 102 is not limited to the superconductive coil and may be configured using a normal conductive coil or the like.

The gradient coil section 106 generates three gradient magnetic fields for respectively causing the intensities of static magnetic fields to have gradients or slopes in the directions of three axes normal to one another, i.e., a slice axis, a phase axis and a frequency axis.

The gradient magnetic field in the slice axis direction is also called a slice gradient magnetic field. The gradient magnetic field in the phase axis direction is also called a phase encode gradient magnetic field. The gradient magnetic field in the frequency axis direction is also called a read out gradient magnetic field. The read out gradient magnetic field is synonymous with a frequency encode gradient magnetic field. In order to enable the generation of such gradient magnetic fields, the gradient coil section 106 has unillustrated 3-systematic gradient coils. The gradient magnetic fields are also called simply gradients below.

The RF coil section 108 forms a high frequency magnetic field for exciting a spin within a body of the target 1 in a static magnetic field space. The formation of the high frequency magnetic field is hereinafter also called transmission of an RF excitation signal. Further, the RF excitation signal is also called an RF pulse. An electromagnetic wave or a magnetic resonance signal generated by the excited spin is received by the RF coil section 108.

The magnetic resonance signal results in a signal in a frequency domain or Fourier space. Since the magnetic resonance signal is encoded by two axes according to the gradients in the phase-axis and frequency-axis directions, the magnetic resonance signal is obtained as a signal in a two-dimensional Fourier space. A phase encode gradient and a read out gradient determine each sampling position of the signal in the two-dimensional Fourier space. The two-dimensional Fourier space is also called a "k space" below.

Figure 2:
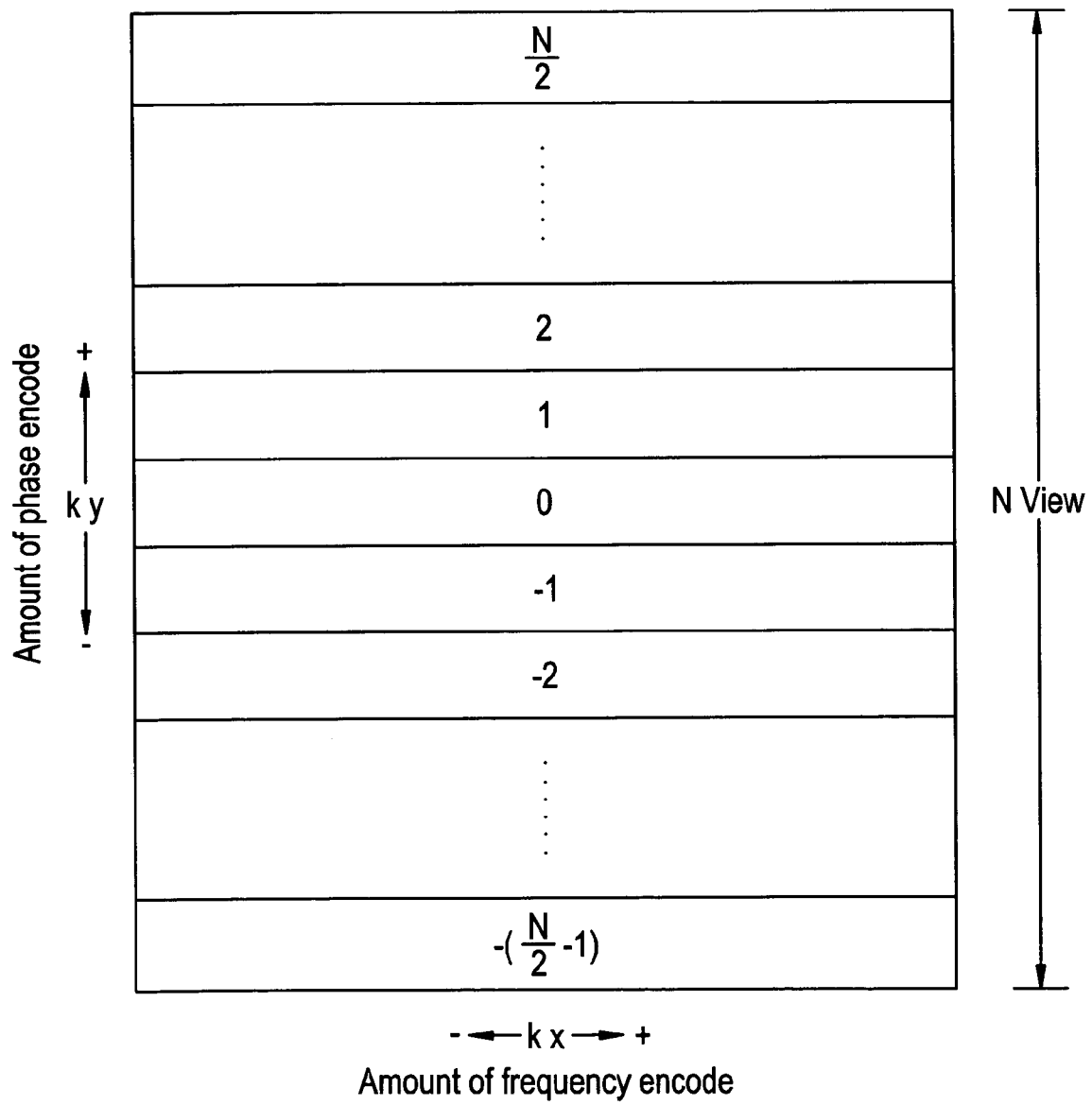
FIG. 2 is a diagram illustrating the concept of a k space.

By reading an echo signal MR according to phase encode and frequency encode, a data in the k-space is subjected to sampling. A k-space conceptual diagram is shown in FIG. 2. As shown in the same drawing, a horizontal axis kx in the k-space indicates a frequency axis and a vertical axis ky in the k-space indicates a phase axis, respectively.

In the same drawing, a plurality of rectangles long from side to side respectively indicate data sampling positions on the phase axis. Each of numerals entered in the rectangles indicates the amount of phase encode. The amount of phase encode has been normalized by $\pi/N$. N indicates the number of samplings in a phase direction. The number of samplings in the phase direction is also called the number of phase encodes or the number of views. N ranges from 64 to 256, for example.

The amount of phase encode becomes 0 in the center of the phase axis ky. The amount of phase encoding gradually increases from the center to both ends. The polarities of their increases are opposite to each other. A sampling interval, i.e., the difference in step between the amounts of phase encodes is expressed in $\pi/N$.

A gradient driver 130 is connected to the gradient coil section 106. The gradient driver 130 supplies a drive signal to the gradient coil section 106 to generate a gradient magnetic field. The gradient driver 130 has unillustrated 3-systematic drive circuits in association with the 3-systematic gradient coils in the gradient coil section 106.

An RF driver 140 is connected to the RF coil section 108. The RF driver 140 supplies a drive signal to the RF coil section 108 to transmit an RF pulse, thereby exciting the spin in the body of the target 1.

A data collecting section 150 is connected to the RF coil section 108. The data collecting section 150 collects a signal received by the RF coil section 108 as a digital data.

Upon data collection, the received signal is amplified by an amplifier, and the amplified signal is converted into a digital data by an A/D (analog-to-digital) converter. The gain of the amplifier is adjustable. Namely, the data collecting section 150 is capable of adjusting the received gain. The received gain is also called simply gain below.

A controller 160 is connected to the cradle driver 120, the gradient driver 130, the RF driver 140 and the data collecting section 150. The controller 160 controls the cradle driver 120 through the data collecting section 150 respectively to execute imaging. An adjustment to the gain of the data collecting section 150 is also performed by the controller. The gain adjustment will be explained later again.

The controller 160 is configured using a computer or the like, for example. The controller 160 has an unillustrated memory. The memory stores a program and various data for the controller 160 therein. The function of the controller 160 is implemented by allowing the computer to execute the program stored in the memory.

The output side of the data collecting section 150 is connected to a data processor 170. The data collected by the data collecting section 150 is inputted to the data processor 170. The data processor 170 causes a memory 172 to store the data collected by the data collecting section 150. The data processor 170 is configured using a computer or the like, for example. The memory 172 stores a program and various data for the data processor 170 therein.

A data space is formed in the memory 172. The data space corresponds to the k-space. The data processor 170 transforms the data in the k-space into two-dimensional inverse Fourier form to thereby reconstruct an image.

The data processor 170 is connected to the controller 160. The data processor 170 is above the controller 160 in rank and generally controls it. The function of this apparatus is realized by allowing the data processor 170 to execute the program stored in the memory 172.

A display section 180 and an operation section 190 are connected to the data processor 170. The display section 180 is made up of a graphic display or the like. The operation section 190 is constructed of a keyboard or the like provided with a pointing device.

The display section 180 displays a reconstructed image and various information outputted from the data processor 170. The operation section 190 is operated by a user and inputs various commands and information or the like to the data processor 170. The user controls this apparatus on an interactive manner through the display section 180 and the operation section 190.

Figure 3:
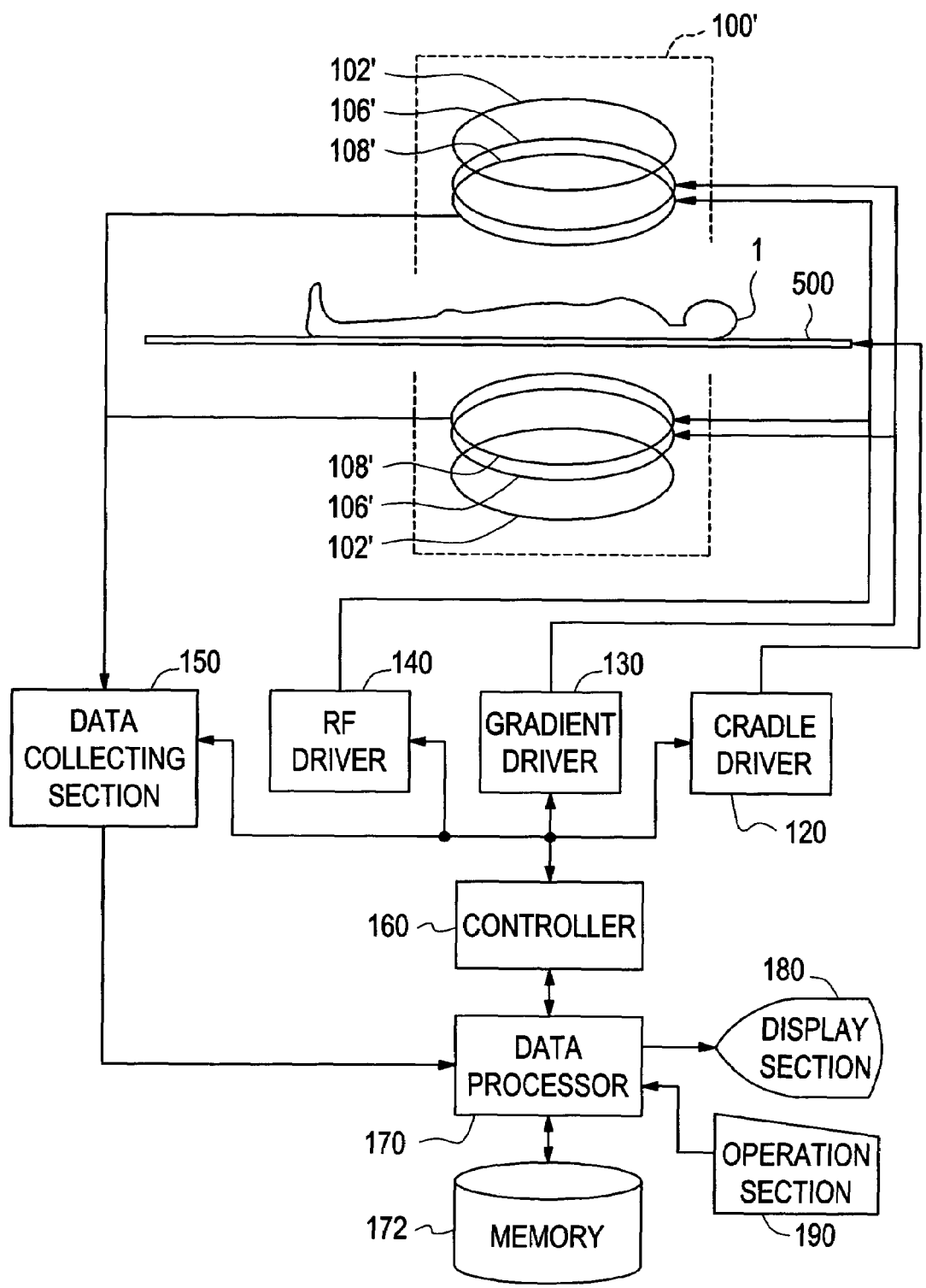
FIG. 3 is a block diagram of an apparatus showing one example of an embodiment of the present invention.

A block diagram of a magnetic resonance imaging apparatus of another type is shown in FIG. 3. The magnetic resonance imaging apparatus shown in the same drawing is one example illustrative of an embodiment of the present invention. One example illustrative of an embodiment related to an apparatus of the present invention is shown according to the configuration of this apparatus. One example illustrative of an embodiment related to a method of the present invention is shown according to the operation of this apparatus.

This apparatus has a magnetic apparatus 100' different in type or scheme from the apparatus shown in FIG. 1. Those other than the magnet apparatus 100' are similar in configuration to the apparatus shown in FIG. 1. Similar portions are respectively identified by the same reference numerals and their description will therefore be omitted.

The magnetic apparatus 100' has a main magnetic field magnet section 102', a gradient coil section 106' and an RF coil section 108'. Any of these main magnetic field magnet section 102' and respective coil sections is constructed of paired ones opposed to one another with a space interposed therebetween. Further, any of them has a substantially disc shape and is placed with its central axis held in common. A target 1 (patient) is placed on a cradle 500 in an internal bore of the magnetic apparatus 100' and carried in and out by unillustrated conveying means.

The main magnetic field magnet section 102' forms a static magnetic field in the internal bore of the magnetic apparatus 100'. The direction of the static magnetic field is approximately orthogonal to the direction of a body axis of the target 1. Namely, the main magnetic field magnet section 102' forms a so-called vertical magnetic field. The main magnetic field magnet section 102' is constructed using a permanent magnet or the like, for example. Incidentally, the main magnetic field magnet section 102' is not limited to the permanent magnet and may be configured using a superconductive electromagnet or a normal conductive electromagnet or the like.

The gradient coil section 106' produces three gradient magnetic fields for respectively causing the intensities of static magnetic fields to have gradients or slopes in the directions of three axes normal to one another, i.e., a slice axis, a phase axis and a frequency axis. In order to enable the generation of the gradient magnetic fields in the three-axis directions, the gradient coil section 106' has unillustrated 3-systematic gradient coils.

The RF coil section 108' transmits an RF pulse for exciting a spin in a body of the target 1 to a static magnetic field space. An electromagnetic wave or a magnetic resonance signal by which the excited spin is produced, is received by the RF coil section 108'. The signal received by the RF coil section 108' is inputted to the data collecting section 150.

Figure 4:
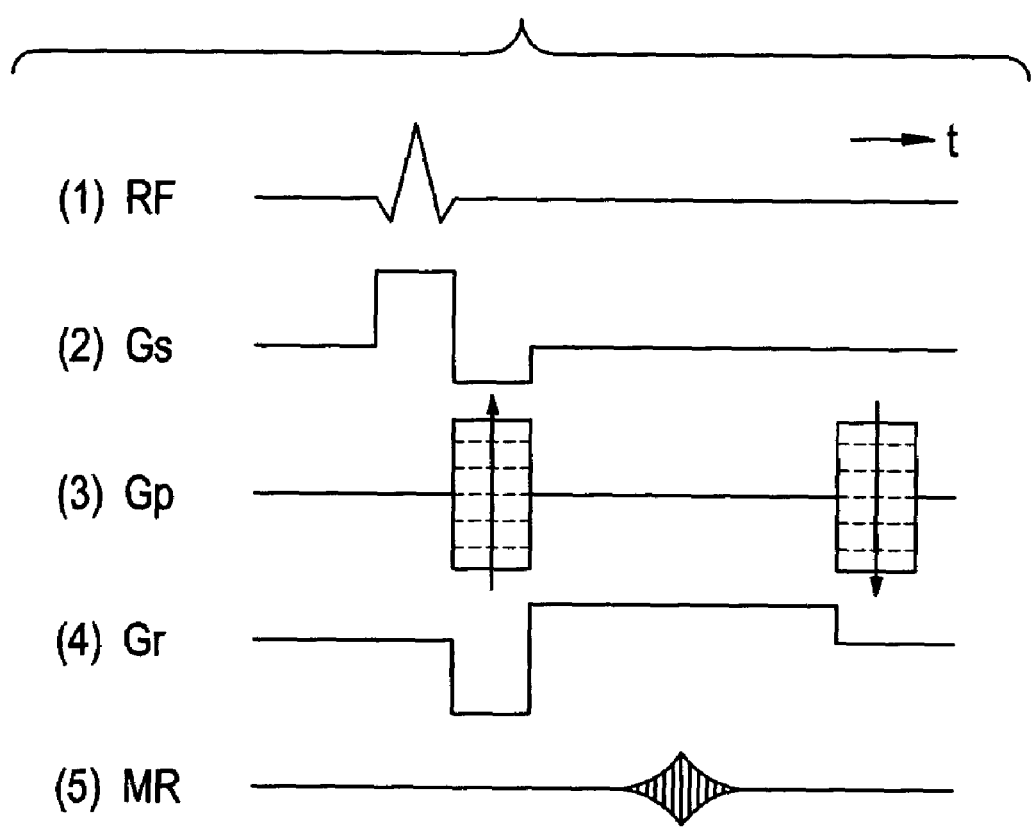
FIG. 4 is a diagram showing one example of an imaging pulse sequence.

One example of a pulse sequence used for imaging is shown in FIG. 4. This pulse sequence is a pulse sequence of a GRASS (gradient recalled echo with steady state).

Namely, (1) shows a sequence of an RF pulse at the GRASS. (2), (3), (4) and (5) similarly respectively show sequences of a slice gradient Gs, a phase encode gradient Gp, a read out gradient Gr, and a gradient echo MR. The pulse sequence proceeds from left to right along a time axis t.

As shown in the same drawing, the excitation for the spin is carried out based on the RF pulse. At this time, the slice gradient Gs is applied to effect selective excitation on a predetermined slice. After the RF excitation, the spin is phase-encoded based on the phase encode gradient Gp. Next, the spin is firstly dephased based on the read out gradient Gr. Then the spin is rephased to read a gradient echo MR. After the echo reading, the rewinding of the phase encode gradient Gp is performed. The gradient echo MR is collected as a view data by the data collecting section 150.

Such a pulse sequence is repeated, for example, 64 to 512 times in a predetermined cycle TR (repetition time). The phase encode gradient Gp is changed every TR and different phase encodes are carried out every time. Thus, view data for 64 to 512 views, for example, can be obtained.

The view data obtained by such a pulse sequence are collected into a memory 172 of a data processor 170. The data processor 170 reconstructs an image, based on the view data collected into the memory 172.

Incidentally, the pulse sequence is not limited to the GRASS. It may be other suitable pulse sequences such as a spin echo (SE: Spin Echo) method, an echo planar imaging (EPI: Echo Planar Imaging) method, etc.

Figure 5:
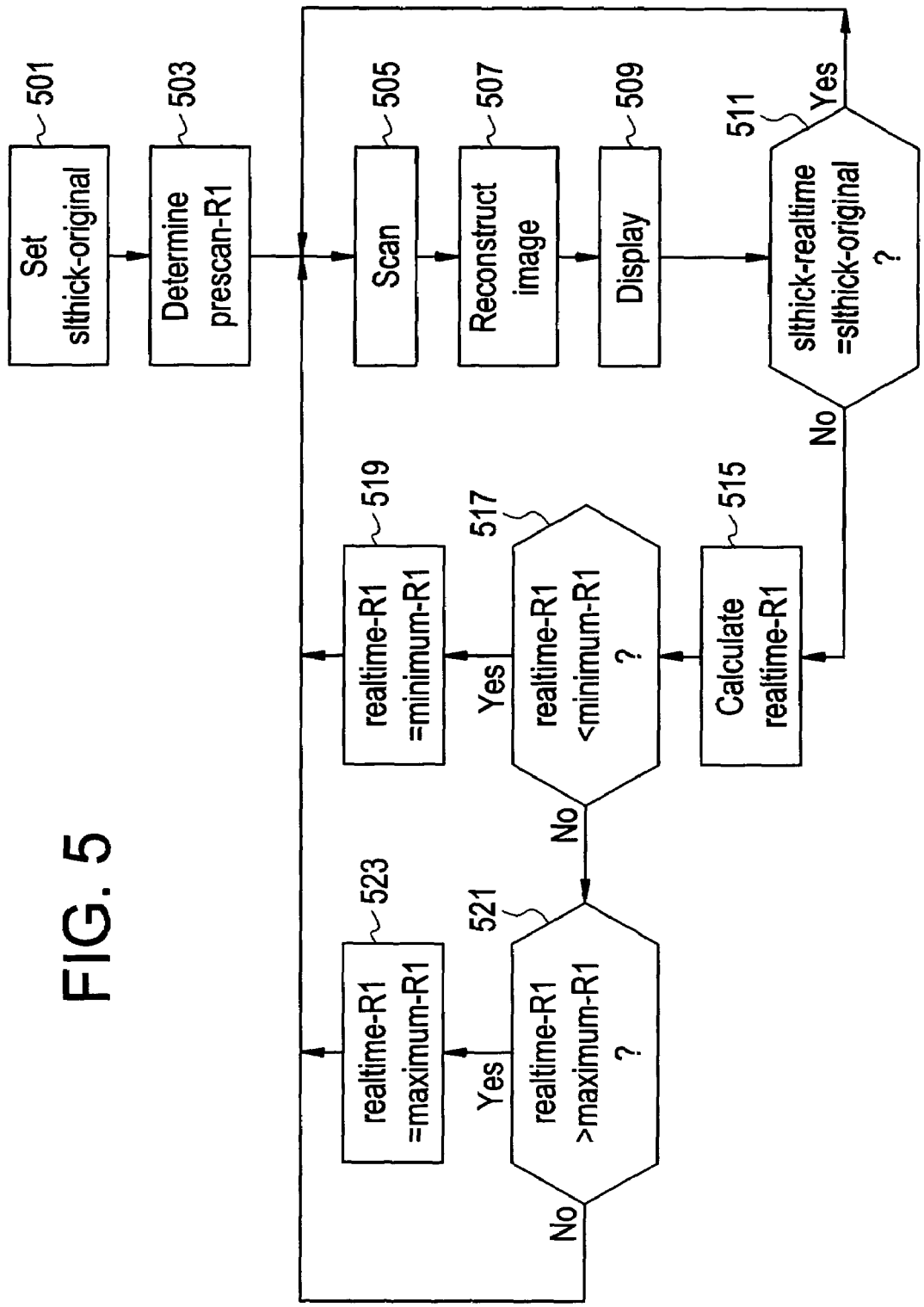
FIG. 5 is a flow diagram for describing the operation of the apparatus showing one example of the embodiment of the present invention.

The operation of this apparatus will be explained. A flow diagram for describing the operation of this apparatus is shown in FIG. 5. As shown in the same drawing, a slice thickness slthick-original is set in stage 501. The setting of the slice thickness is carried out through an operation section 190 by a user. The slice thickness slthick-original is set to a user's intended value.

Next, a gain prescan-R1 for echo reception is determined in Stage 503. The value of the gain prescan-R1 is determined to an optimum value. Such a gain is determined based on the result of prescans tried plural times while the gain is being changed. Consequently, the gain prescan-R1 fit for the slice thickness slthick-original is determined.

Next, the scan is performed in Stage 505. The scan is performed by the GRASS, for example. The slice thickness at this time is slthick-original, and the gain for the echo reception is prescan-R1. Incidentally, the scan may be done by suitable techniques such as EPI, etc. without being limited to the GRASS.

Next, image reconstruction is performed in Stage 507 and an image is displayed in Stage 509. The scan, image reconstruction and display are carried out in real time. The user grasps the state of an affected area based on the displayed image. The user sets the slice thickness to a new value as needed during imaging to better grasp or recognize the state of the affected area. The new setting of the slice thickness is also carried out through the operation section 190.

Next, it is determined in Stage 511 whether the newly-set slice thickness slthick-realtime is equal to the firstly-set slice thickness slthick-original.

When they are found to be equal to each other, this apparatus returns to Stage 505. In Stage 505, the scan is done under the same conditions as the initial setting. Image reconstruction is carried out based on its resultant scan data in Stage 507, and an image is displayed in Stage 509. While slthick-realtime=slthick-original, such a procedure is repeated.

When it is found not to be slthick-realtime=slthick-original, a new gain realtime-R1 for echo reception is calculated in Stage 515. The gain realtime-R1 is calculated by the following equation:

$$realtime\text{-}R1=(prescan\text{-}R1-(int)(log(slthick\text{-}realtime/slthick\text{-}original)+0.99))$$

As expressed in the above equation, the new gain realtime-R1 results in one wherein the initially set gain prescan-R1 is corrected with a correction term. The correction term results in a whole number equivalent to one obtained by adding a constant 0.99 to the logarithm of a ratio between the newly-set slice thickness slthick-realtime and the firstly-set slice thickness slthick-original.

When slthick-realtime is found to be larger than slthick-original from the execution of such a calculation, i.e., when the newly-set slice thickness is larger than the firstly-set slice thickness, gain smaller than the initially set gain prescan-R1 is obtained. Since such a decrease in gain compensates for an increase in signal strength with the increase in slice thickness, it results in one fit for the newly-set slice thickness.

On the other hand, when slthick-realtime is smaller than slthick-original, i.e., when the newly-set slice thickness is smaller than the firstly-set slice thickness, a gain larger than the initially set gain prescan-R1 is obtained. Since such an increase in gain compensates for a decrease in signal strength with the decrease in slice thickness, it results in one fit for the newly-set slice thickness.

Next, it is determined in Stage 517 whether realtime-R1<minimum-R1. The minimum-R1 is of the minimum value of a gain allowed by this apparatus. When it is found not to be realtime-R1<minimum-R1, it is determined in Stage 521 whether realtime-R1>maximum-R1. The maximum-R1 is of the maximum value of a gain allowed by this apparatus.

When it is found to be neither realtime-R1<minimum-R1 nor realtime-R1>maximum-R1, this apparatus returns to Stage 505 where the scan is done. The slice thickness at the present scan is slthick-realtime and the gain for echo reception is realtime-R1 given by the above equation. Thus, the scan is done under the newly-set slice thickness and the gain fit therefor. While neither realtime-R1<minimum-R1 nor realtime-R1>maximum-R1 is being established, the above operation is repeated.

Accordingly, the user is capable of performing realtime imaging while changing the slice thickness at will. Since, at this time, the gain is automatically adjusted following the change in slice thickness, the echo reception is always performed with a good SNR. Further, clipping due to an over range of an A/D converter does not occur. Therefore, a reconstructed image good in quality can be obtained even with respect to any slice thickness.

When realtime-R1<minimum-R1, the scan of Stage 505 is done under realtime-R1=minimum-R1 in Stage 519. When realtime-R1>maximum-R1, the scan of Stage 505 is carried out under realtime-R1=maximum-R1. in Stage 523. Thus, when the gain calculated in the above equation exceeds an allowable limit for this apparatus, the echo reception is performed at gain restricted to its limit value. With the gain being restricted to within the allowable limit, the echo reception can stably be performed. Incidentally, such a gain restriction may be carried out as needed. Any one of them or both can be omitted as the case may be.

Figure 6:
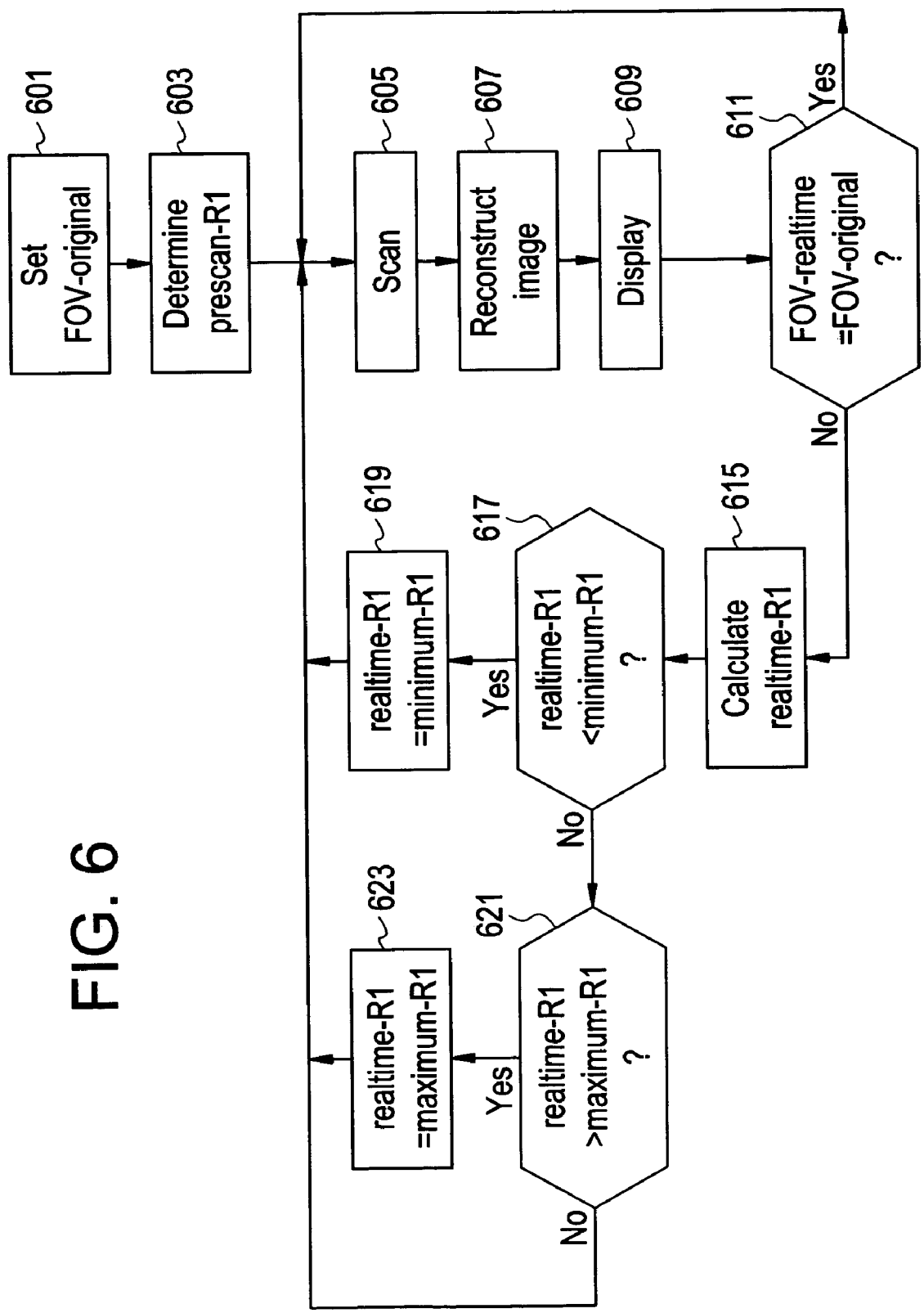
FIG. 6 is a flow diagram for describing the operation of the apparatus showing one example of the embodiment of the present invention.

There may be a case in which a field of view (FOV) is changed during imaging upon real-time imaging. Even as to the change in FOV, a gain adjustment based on the above is enabled. A flow diagram for describing the operation of this apparatus where such a gain adjustment is done, is shown in FIG. 6.

As shown in the same drawing, a field of view FOV-original is set in Stage 601. The setting of the field of view is done by a user through the operation section 190. The field of view FOV-original is set to a user's intended value.

Next, a gain prescan-R1 for echo reception is determined in Stage 603. The value of the gain prescan-R1 is determined to the optimum value. Such gain is determined based on the result of prescans tried plural times while the gain is being changed. Consequently, the gain prescan-R1 fit for the field of view FOV-original is determined.

Next, the scan is performed in Stage 605. The scan is performed by the GRASS, for example. The field of view at this time is FOV-original, and the gain for the echo reception is prescan-R1. Incidentally, the scan may be done by suitable techniques such as EPI, etc. without being limited to the GRASS.

Next, image reconstruction is performed in Stage 607 and an image is displayed in Stage 609. The scan, image reconstruction and display are carried out in real time. The user grasps the state of an affected area based on the displayed image. The user sets the field of view to a new value as needed during imaging to better grasp or recognize the state of the affected area. The new setting of the field of view is also carried out through the operation section 190.

Next, it is determined in Stage 611 whether the newly-set field of view FOV-realtime is equal to the firstly-set field of view FOV-original.

When they are found to be equal to each other, this apparatus returns to Stage 605. In Stage 605, the scan is done under the same conditions as the initial setting. Image reconstruction is carried out based on its resultant scan data in Stage 607, and an image is displayed in Stage 609. While FOV-realtime=FOV-original, such a procedure is repeated.

When it is found not to be FOV-realtime=FOV-original, a new gain realtime-R1 for echo reception is calculated in Stage 615. The gain realtime-R1 is calculated by the following equation:

realtime-$R1$=(prescan-$R1$−(int)(log(FOV-realtime/FOV-original)+0.99))

As expressed in the above equation, the new gain realtime-R1 results in one wherein the initially set gain prescan-R1 is corrected with a correction term. The correction term results in a whole number equivalent to one obtained by adding a constant 0.99 to the logarithm of a ratio between the newly-set field of view FOV-realtime and the firstly-set field of view FOV-original.

When FOV-realtime is found to be larger than FOV-original from the execution of such a calculation, i.e., when the newly-set field of view is larger than the firstly-set field of view, gain smaller than the initially set gain prescan-R1 is obtained. Since such a decrease in gain compensates for an increase in signal strength with the increase in field of view, it results in one fit for the newly-set field of view.

On the other hand, when FOV-realtime is smaller than FOV-original, i.e., when the newly-set field of view is smaller than the firstly-set field of view, gain larger than the initially set gain prescan-R1 is obtained. Since such an increase in gain compensates for a decrease in signal strength with the decrease in field of view, it results in one fit for the newly-set field of view.

Next, it is determined in Stage 617 whether realtime-R1<minimum-R1. The minimum-R1 is of the minimum value of gain allowed by this apparatus. When it is found not to be realtime-R1<minimum-R1, it is determined in Stage 621 whether realtime-R1>maximum-R1. The maximum-R1 is of the maximum value of gain allowed by this apparatus.

When it is found to be neither realtime-R1<minimum-R1 nor realtime-R1>maximum-R1, this apparatus returns to Stage 605 where the scan is done. The field of view at the present scan is FOV-realtime, and the gain for echo reception is realtime-R1 given by the above equation. Thus, the scan is done under the newly-set field of view and the gain fit therefor. While neither realtime-R1<minimum-R1 nor realtime-R1>maximum-R1 is being established, the above operation is repeated.

Accordingly, the user is capable of performing realtime imaging while changing the field of view at will. Since, at this time, the gain is automatically adjusted following the change in field of view, the echo reception is always performed with a good SNR. Further, no clipping or the like does not occur. Therefore, a reconstructed image good in quality can be obtained even with respect to any field of view.

When realtime-R1<minimum-R1, the scan of Stage 605 is done under realtime-R1=minimum-R1 in Stage 619. When realtime-R1>maximum-R1, the scan of Stage 605 is carried out under realtime-R1=maximum-R1 in Stage 623. Thus, when the gain calculated in the above equation exceeds an allowable limit for this apparatus, the echo reception is performed at gain restricted to its limit value. With the gain being restricted to within the allowable limit, the echo reception can stably be performed. Incidentally, such a gain restriction may be carried out as needed. Any one of them or both can be omitted as the case may be.

Figure 7:
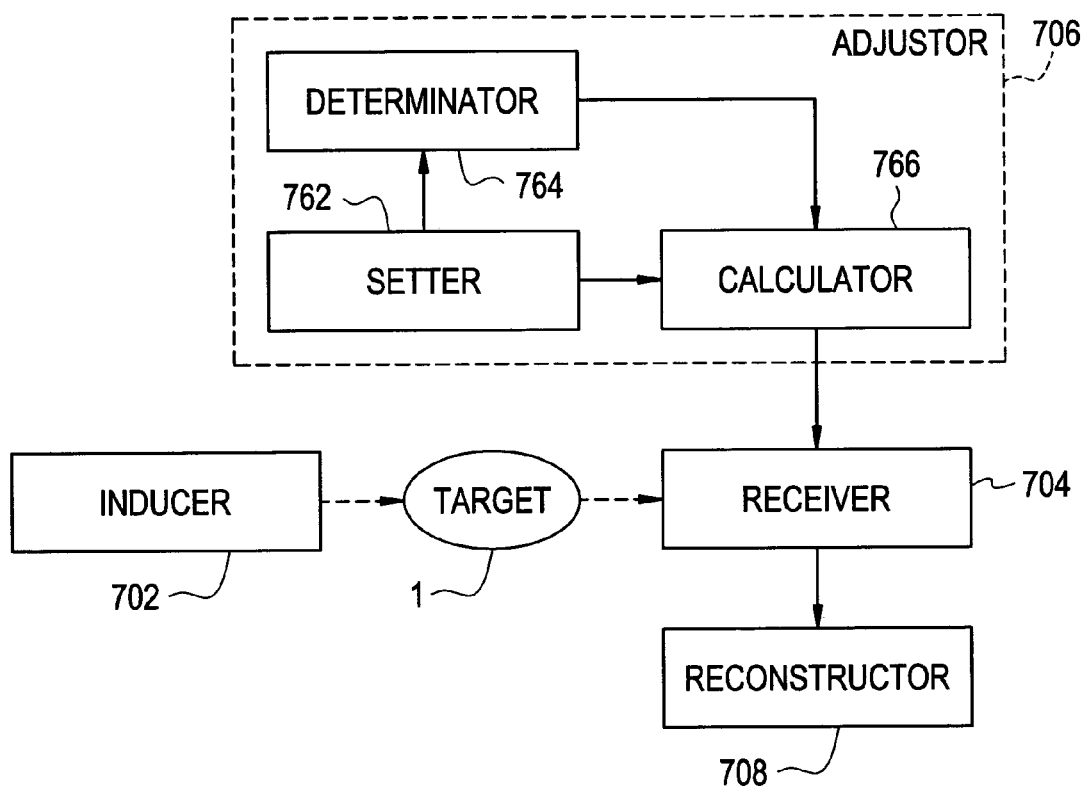
FIG. 7 is a function block diagram of a apparatus showing one example of an embodiment of the present invention.

A functional block diagram of this apparatus in which attention has focused on the above-described gain adjustment, is shown in FIG. 7. As shown in the same drawing, this apparatus induces a magnetic resonance signal for a target 1 through an inducer 702, receives the magnetic resonance signal at a receiver 704, and reconstructs an image through a reconstructor 708, based on the magnetic resonance signal.

The inducer 702 corresponds to a function of a portion comprising the main magnetic field coil section 102 (main magnetic field magnet section 102'), gradient coil section 106 (106'), RF coil section 108 (108'), gradient driver 130 and RF driver 140. The inducer 702 is one example illustrative of an embodiment of inducing means according to the present invention.

The receiver 704 corresponds to a function of a portion comprising the RF coil section 108 (108') and data collecting section 150. The receiver 704 is one example illustrative of an embodiment of receiving means according to the present invention. The reconstructor 708 corresponds to the function of the data processor 170. The reconstructor 708 is one example illustrative of an embodiment of reconstructing means according to the present invention.

An adjustor 706 adjusts the gain of the receiver 704. The adjustor 706 has a setter 762, a determinator 764 and a calculator 766. The setter 762 sets a slice thickness or FOV under a user's operation. The determinator 764 determines a gain fit for an initial setting of the slice thickness or FOV. The calculator 766 calculates the gain for the receiver 704 based on the slice thickness or FOV supplied thereto from the setter 762 and the gain supplied thereto from the determinator 764.

The adjustor 706 corresponds to a function of a portion comprising the controller 160, data processor 170, display section 180 and operation section 190. The adjustor 706 is one example illustrative of an embodiment of adjusting means according to the present invention. The setter 762 is one example illustrative of an embodiment of setting means according to the present invention. The determinator 764 is one example illustrative of an embodiment of determining means according to the present invention. The calculator 766 is one example illustrative of an embodiment of calculating means according to the present invention.

Many widely different embodiments of the invention may be configured without departing from the spirit and the scope of the present invention. It should be understood that the present invention is not limited to the specific embodiments described in the specification, except as defined in the appended claims.

The invention claimed is:

1. A gain adjustment method, wherein in adjusting a gain for reception of a magnetic resonance signal in a magnetic resonance imaging apparatus, when an initially set value of a slice thickness is slthick-original, and a gain fit therefor is prescan-R1, a gain realtime-R1 fit for a changed value slthick-realtime of the slice thickness is represented as follows:

realtime-$R1$=(prescan-$R1$−(int)(log(slthick-realtime/slthick-original)+0.99)).

2. A gain adjustment method according to claim 1, wherein when said gain realtime-R1 is larger than a predetermined maximum value maximum-R1, realtime-R1=maximum-R1 is established.

3. A gain adjustment method according to claim 1, wherein when the gain realtime-R1 is smaller than a predetermined minimum value minimum-R1, realtime-R1=minimum-R1 is established.

4. A gain adjustment method, wherein in adjusting gain for reception of a magnetic resonance signal in a magnetic resonance imaging apparatus, when an initially set value of a field of view is FOV-original, and a gain fit therefor is prescan-R1, a gain realtime-R1 fit for a changed value FOV-realtime of the field of view is represented as follows:

realtime-$R1$=(prescan-$R1$−(int)(log(FOV-realtime/FOV-original)+0.99)).

5. A gain adjustment method according to claim 4, wherein when said gain realtime-R1 is larger than a predetermined maximum value maximum-R1, realtime-R1=maximum-R1 is established.

6. A gain adjustment method according to claim 4, wherein when the gain realtime-R1 is smaller than a predetermined minimum value minimum-R1, realtime-R1=minimum-R1 is established.

7. A magnetic resonance imaging apparatus having:
- an inducing device for applying a static magnetic field, a gradient magnetic field and an RF magnetic field to a target to be imaged to generate a magnetic resonance signal;
- a receiving device for receiving said generated magnetic resonance signal;
- an adjusting device for adjusting a gain of said receiving device; and
- a reconstructing device for reconstructing an image based on said received magnetic resonance signal,
- wherein said adjusting device comprises:
  - a setting device for setting a slice thickness;
  - a determining device for determining a gain fit for an initially set value of said slice thickness; and
  - a calculating device for obtaining a gain realtime-R1 fit for a changed value slthick-realtime of the slice thickness by means of the following equation when an initially set value of said slice thickness is slthick-original, and a gain fit therefor is prescan-R1:

realtime-$R1$=(prescan-$R1$−(int)(log(slthick-realtime/slthick-original)+0.99)).

8. A magnetic resonance imaging apparatus according to claim 7, further having limiting device for establishing realtime-R1=maximum-R1 when said gain realtime-R1 is larger than a predetermined maximum value maximum-R1.

9. A magnetic resonance imaging apparatus according to claim 7, further having limiting device for establishing realtime-R1=minimum-R1 when said gain realtime-R1 is smaller than a predetermined minimum value minimum-R1.

10. A magnetic resonance imaging apparatus having:
- an inducing device for applying a static magnetic field, a gradient magnetic field and an RF magnetic field to a target to be imaged to generate a magnetic resonance signal;
- a receiving device for receiving said generated magnetic resonance signal;
- an adjusting device for adjusting a gain of said receiving device; and
- a reconstructing device for reconstructing an image based on said received magnetic resonance signal,
- wherein said adjusting device comprises:
  - a setting device for setting a field of view;
  - a determining device for determining a gain fit for an initially set value of said field of view, and
  - a calculating device for obtaining a gain realtime-R1 fit for a changed value FOV-realtime of the field of view by means of the following equation when an initially set value of said field of view is FOV-original, and a gain fit therefor is prescan-R1:

realtime-$R1$=(prescan-$R1$−(int)(log(FOV-realtime/FOV-original)+0.99)).

11. A magnetic resonance imaging apparatus according to claim 10, further having limiting device for establishing realtime-R1=maximum-R1 when said gain realtime-R1 is larger than a predetermined maximum value maximum-R1.

12. A magnetic resonance imaging apparatus according to claim 10, further having limiting device for establishing realtime-R1=minimum-R1 when said gain realtime-R1 is smaller than a predetermined minimum value minimum-R1.

* * * * *